United States Patent
Chang

(10) Patent No.: US 10,331,046 B2
(45) Date of Patent: *Jun. 25, 2019

(54) HOMOGENEOUS THERMAL EQUALIZATION WITH ACTIVE DEVICE

(71) Applicant: Taiwan Semiconductor Manufacturing Co., Ltd., Hsin-Chu (TW)

(72) Inventor: Shih-Ming Chang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/222,075

(22) Filed: Dec. 17, 2018

(65) Prior Publication Data

US 2019/0121249 A1    Apr. 25, 2019

Related U.S. Application Data

(63) Continuation of application No. 15/898,920, filed on Feb. 19, 2018, now Pat. No. 10,162,275, which is a
(Continued)

(51) Int. Cl.
 *G03F 7/20* (2006.01)
(52) U.S. Cl.
 CPC ...... *G03F 7/70875* (2013.01); *G03F 7/70866* (2013.01)
(58) Field of Classification Search
 CPC ..... G03F 7/707–70716; G03F 7/70791; G03F 7/70866; G03F 7/70875; H01L 21/68;
(Continued)

(56) References Cited

U.S. PATENT DOCUMENTS 5,063,582 A * 11/1991 Mori ............... G03F 7/707
                                                    250/443.1
6,238,830 B1   5/2001 Rangarajan et al.
(Continued)

OTHER PUBLICATIONS

Non-Final Office Action dated Sep. 8, 2015 for U.S. Appl. No. 14/019,614.
(Continued)

*Primary Examiner* — Colin W Kreutzer

(74) *Attorney, Agent, or Firm* — Eschweiler & Potashnik, LLC

(57) ABSTRACT

A system and method is provided for providing a thermal distribution on a workpiece during a lithographic process. The system provides a source of lithographic energy to workpiece, such as a workpiece having a lithographic film formed thereover. A workpiece support having a plurality of thermal devices embedded therein is configured to support the workpiece concurrent to an exposure of the workpiece to the lithographic energy. A controller individually controls a temperature of each of the plurality of thermal devices, therein controlling a specified temperature distribution across the workpiece associated with the exposure of the workpiece to the lithographic energy. Controlling the temperature of the thermal devices can be based on a model, a measured temperature of the workpiece, and/or a prediction of a temperature at one or more locations on the workpiece.

20 Claims, 10 Drawing Sheets

Related U.S. Application Data continuation of application No. 15/391,069, filed on Dec. 27, 2016, now Pat. No. 9,897,929, which is a continuation of application No. 14/019,614, filed on Sep. 6, 2013, now Pat. No. 9,541,846.

(58) Field of Classification Search
CPC ... H01L 21/682; H01L 21/683; H01L 21/687; H01L 21/68714
USPC ..... 310/12.05, 12.06, 12.29; 355/30, 72, 75, 355/77
See application file for complete search history.

(56) References Cited

U.S. PATENT DOCUMENTS

| | | | |
|---|---|---|---|
| 6,373,071 | B1 | 4/2002 | Innes et al. |
| 9,541,846 | B2 | 1/2017 | Chang |
| 9,897,929 | B2 | 2/2018 | Chang |
| 10,162,275 | B2 * | 12/2018 | Chang ................. G03F 7/70866 |
| 2005/0211694 | A1 | 9/2005 | Moroz |
| 2006/0033898 | A1 | 2/2006 | Cadee et al. |
| 2007/0153244 | A1 | 7/2007 | Maria Zaal et al. |
| 2009/0207392 | A1 | 8/2009 | Rijpma et al. |
| 2009/0215201 | A1 | 8/2009 | Benjamin et al. |
| 2011/0170085 | A1 | 7/2011 | Sijben |
| 2011/0222033 | A1 | 9/2011 | Ten Kate et al. |
| 2011/0300711 | A1 | 12/2011 | Martin et al. |
| 2012/0013865 | A1 | 1/2012 | Laurent et al. |
| 2012/0162621 | A1 | 6/2012 | Beerens et al. |
| 2012/0307216 | A1 | 12/2012 | Laurent et al. |
| 2013/0045447 | A1 | 2/2013 | Kunnen et al. |
| 2013/0094005 | A1 | 4/2013 | Kunnen et al. |
| 2013/0094009 | A1 | 4/2013 | Lafarre et al. |
| 2013/0189802 | A1 | 7/2013 | Tromp et al. |
| 2014/0127628 | A1 | 5/2014 | Fujimura et al. |
| 2017/0059992 | A1 | 3/2017 | Nakagawa et al. |

OTHER PUBLICATIONS

Final Office Action dated Jan. 29, 2016 for U.S. Appl. No. 14/019,614.
Non-Final Office Action dated May 11, 2016 for U.S. Appl. No. 14/019,614.
Notice of Allowance dated Sep. 2, 2016 for U.S. Appl. No. 14/019,614.
Non-Final Office Action dated Mar. 1, 2017 for U.S. Appl. No. 15/391,069.
Notice of Allowance dated Oct. 6, 2017 for U.S. Appl. No. 15/391,069.
Non-Final Office Action dated Apr. 9, 2018 for U.S. Appl. No. 15/898,920.
Final Office Action dated Aug. 30, 2018 for U.S. Appl. No. 15/898,920.
Notice of Allowance dated Nov. 1, 2018 for U.S. Appl. No. 15/898,920.

* cited by examiner

HOMOGENEOUS THERMAL EQUALIZATION WITH ACTIVE DEVICE

REFERENCE TO RELATED APPLICATIONS

This Application is a Continuation of U.S. application Ser. No. 15/898,920, filed on Feb. 19, 2018, which is a Continuation of U.S. application Ser. No. 15/391,069, filed on Dec. 27, 2016 (now U.S. Pat. No. 9,897,929, issued on Feb. 20, 2018), which is a Continuation of U.S. application Ser. No. 14/019,614, filed on Sep. 6, 2013 (now U.S. Pat. No. 9,541,846, issued on Jan. 10, 2017). The contents of the above-referenced patent applications are hereby incorporated by reference in their entirety.

BACKGROUND

In semiconductor manufacturing, energy commonly flows from an energy source toward a workpiece in order to provide energy to the workpiece or substrate for various purposes. Such energy is often converted into heat in the substrate. For example, in a lithography process, exposure from an energy source such as a light beam raises the temperature of the workpiece. Such an increase in temperature can deleteriously reduce a sensitivity of the photoresist on the workpiece, thus deleteriously affecting the resulting device performance. The increase in temperature can further distort the workpiece, thus leading to errors in focusing and overlays.

Such heating problems become more severe in some advanced lithography tools, such as the Extreme Ultraviolet Lithography (EUVL) and Electron-Beam Direct-Write (EBDW) processing, where the exposure to the energy source occurs in a vacuum. Unlike traditional optical lithography tools or immersion lithography, more advanced lithography tools expose the workpiece to the energy source in a vacuum, where no air or water is typically present to cool the workpiece. Such an absence of convective or cooling can lead to various adverse effects in the resultant processed workpiece.

BRIEF SUMMARY

The following presents an overview of the disclosure in order to provide a basic understanding of one or more aspects of the disclosure. This is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

According to various embodiments, the present disclosure relates to a system and method for providing homogeneous thermal equalization of a workpiece undergoing advanced photolithography. The photolithography can occur in a vacuum or in atmosphere. In one embodiment, a system for providing a specified thermal distribution during a lithographic process is provided. For example, the system and method provide a source of lithographic energy and a workpiece support having a plurality of thermal devices embedded therein. The plurality of thermal devices, for example, comprise one or more of a heat pipe, a Peltier device, a thermal conduit configured to pass a cooling fluid therethrough, and an electric coil.

The workpiece support, for example, is configured to support a workpiece concurrent to an exposure of the workpiece to the lithographic energy. The workpiece, for example, has a lithographic film formed thereover. A controller is further provided, wherein the controller is configured to individually control a temperature of each of the plurality of thermal devices, therein controlling a temperature across the workpiece associated with the exposure of the workpiece to the lithographic energy.

Controlling the temperature of the thermal devices can be based on a model, a measured temperature of the workpiece, and/or a prediction of a temperature at one or more locations on the workpiece. One or more temperature sensors, such as one or more of a thermocouple and pyrometer, can be provided and configured to measure a temperature of the workpiece at a respective location associated with each of the plurality of thermal devices.

In one exemplary aspect, the controller is configured to predict a temperature of the workpiece at one or more predetermined locations on the workpiece. The controller can be further configured to activate one or more of the plurality of thermal devices based, at least in part, on the prediction of the temperature of the workpiece at the one or more predetermined locations. The prediction of the temperature of the workpiece at the predetermined position, for example, is based, at least in part, on a measured temperature at one or more of the predetermined locations on the workpiece. In another example, the controller is configured to activate the plurality of thermal devices based on a model.

DETAILED DESCRIPTION

Figure 1A:
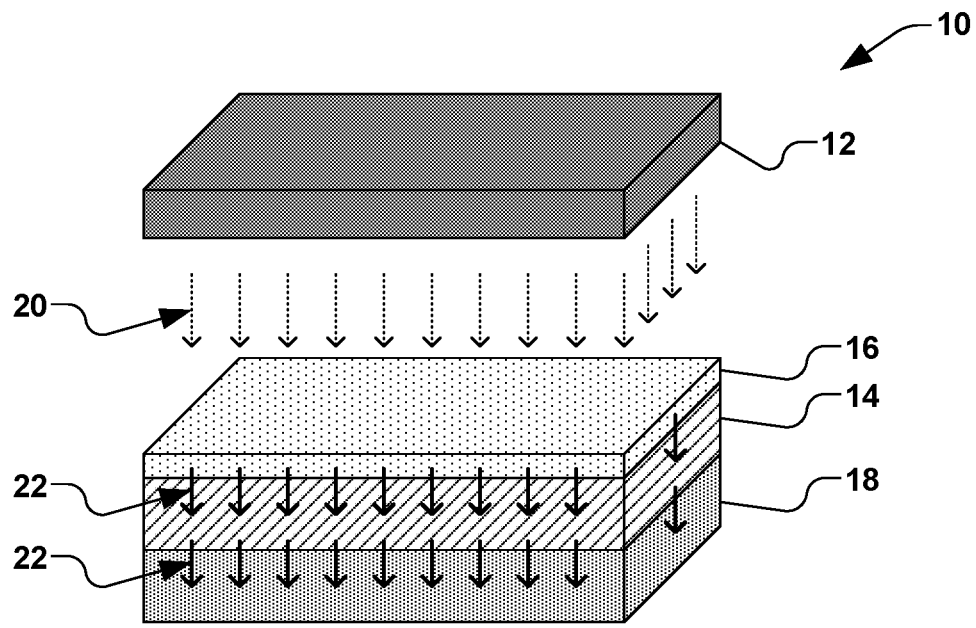
FIG. 1A illustrates an exemplary thermal flow from a broad energy source.

The present disclosure provides a system and apparatus for providing a thermal uniformity across a workpiece. Accordingly, the description is made with reference to the drawings, in which like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Referring now to the Figures, FIG. 1A illustrates an exemplary thermal flow 10 from a conventional broad energy source 12. The conventional broad energy source 12, for example, comprises a mercury lamp, lamp array, a laser source, or an Extreme Ultraviolet (EUV) lithographic energy source. A workpiece 14 having a lithographic film 16 formed thereon is provided on a conventional heat sink 18, such as a solid metal plate (e.g., aluminum). Since a typical EUV lithographic process is performed in a vacuum, a cooling fluid (e.g., gas or liquid) is neither permissible above film 16 nor between the workpiece 14 and the conventional heat sink 18. As such, during an exposure of the workpiece 14 to lithographic energy 20 from the broad energy source 12, thermal energy associated with the broad energy source transfers from the broad energy source through the lithographic film 16 and workpiece 14, and into the heat sink 18 (illustrated by arrows 22).

Figure 1B:
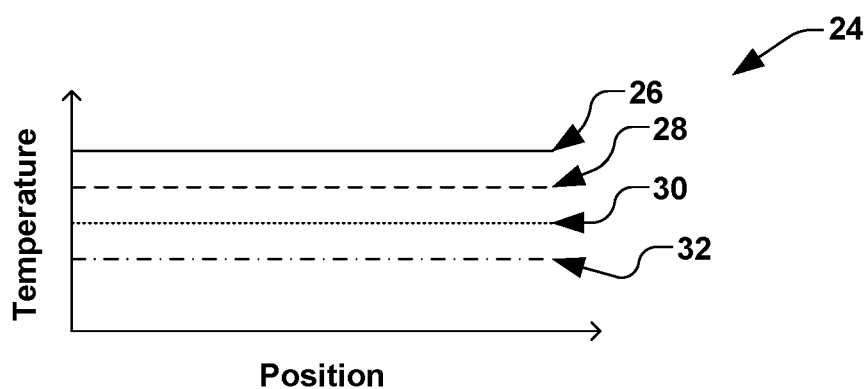
FIG. 1B illustrates a graph of temperature across a workpiece after exposure to the conventional broad energy source of FIG. 1A.

FIG. 1B illustrates a graph 24 showing temperature versus position across the workpiece 14 of FIG. 1A, wherein, in decreasing order, a lithographic film temperature 26, workpiece temperature 28, and heat sink temperature 30 are generally uniform across the workpiece 14. However, as illustrated in FIG. 1B, all of the lithographic film temperature 26, workpiece temperature 28, and heat sink temperature 30 are still greater than a target temperature 32 for the process.

Figure 2A:
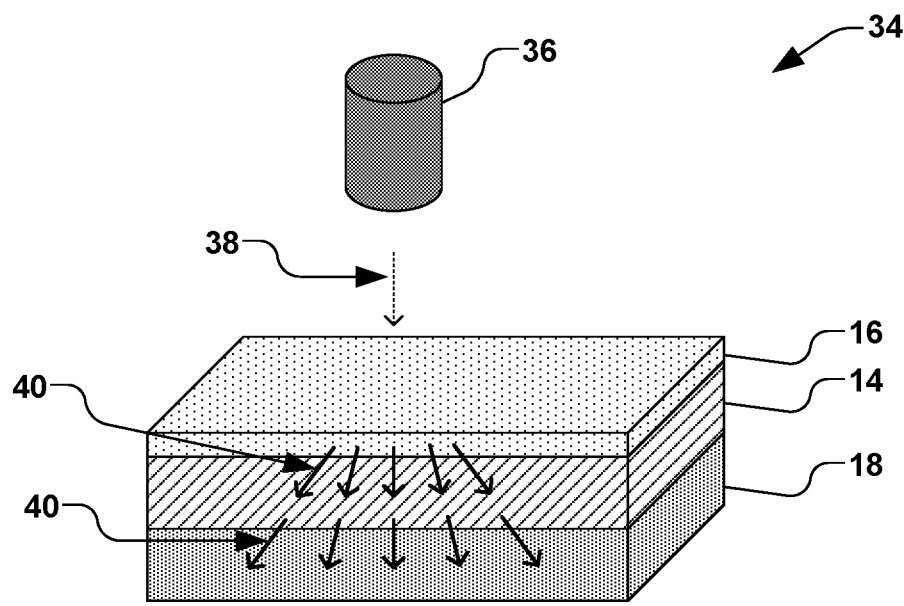
FIG. 2A illustrates an exemplary thermal flow from a focused energy source.

FIG. 2A illustrates another example of a thermal flow 34 from a focused energy source 36, (e.g., a beam source) such as an Electron Beam Direct-Write (EBDW) source or a focused ion beam used for mask repairing. During an exposure of the workpiece 14 to focused lithographic energy 38 from the focused energy source 36, thermal energy associated with the focused energy source transfers from the focused energy source and expands through the lithographic film 16 and workpiece 14, and into the heat sink 18 (illustrated by arrows 40).

Figure 2B:
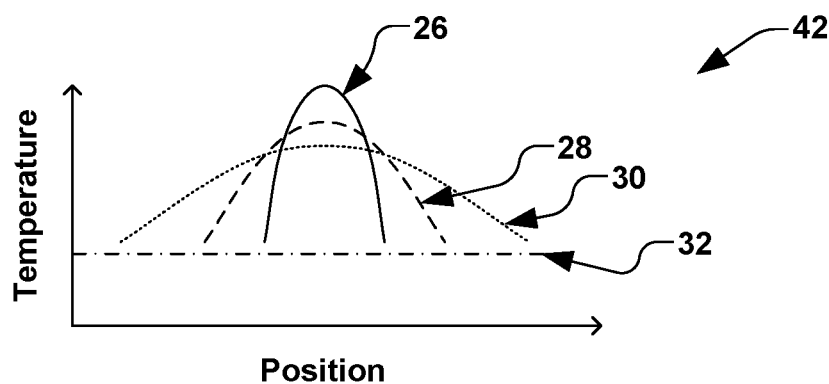
FIG. 2B illustrates a graph of temperature across a workpiece after exposure to the conventional focused energy source of FIG. 2A.

As such, exposure of the workpiece 14 to focused lithographic energy 38 yields a non-uniform temperature distribution as illustrated a graph 42 of FIG. 2B. As can be seen, the lithographic film temperature 26, workpiece temperature 28, and heat sink temperature 30 are non-uniform across the workpiece 14 of FIG. 2A, wherein the temperature of each spikes at the location where the workpiece is exposed to the focused energy source 36. Again, as illustrated in FIG. 2B, all of the lithographic film temperature 26, workpiece temperature 28, and heat sink temperature 30 are not only greater than the target temperature 32 for the process, but also, the respective temperatures are generally non-uniform across the workpiece.

Figure 3A:
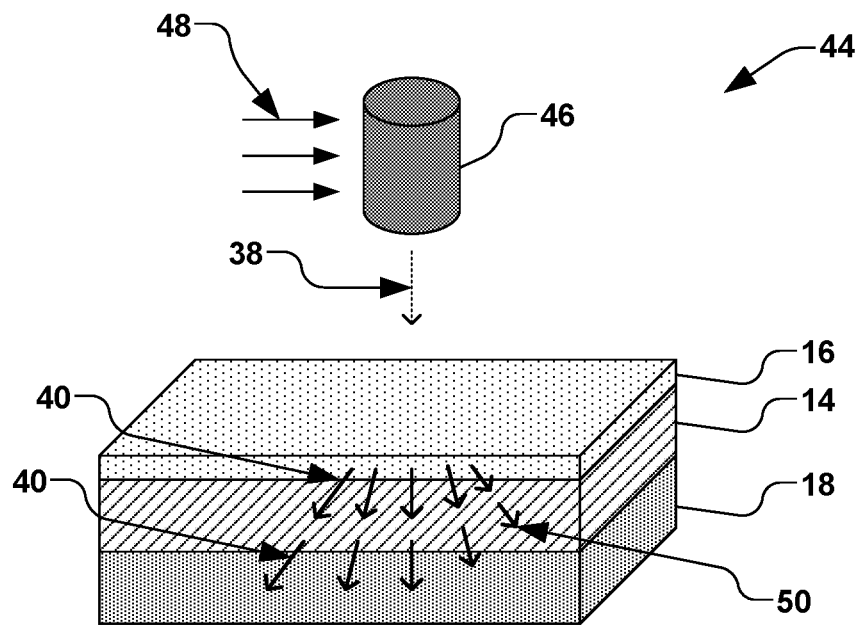
FIG. 3A illustrates an exemplary thermal flow from a moving focused energy source.

FIG. 3A illustrates another example of another thermal flow 44 from a moving focused energy source 46, such as an EBDW source that is scanned (illustrated by arrows 48) across with respect to the workpiece 14. During an exposure of the workpiece 14 to focused lithographic energy 38 from the moving focused energy source 46, thermal energy associated with the focused energy source transfers from the focused energy source and again expands through the lithographic film 16 and workpiece 14, and into the heat sink 18 (illustrated by arrows 40). However, in the case of the moving focused energy source 46, the thermal energy transfer is non-uniform due to the transitory nature of the moving focused energy source (e.g., illustrated by shorter arrows 50).

Figure 3B:
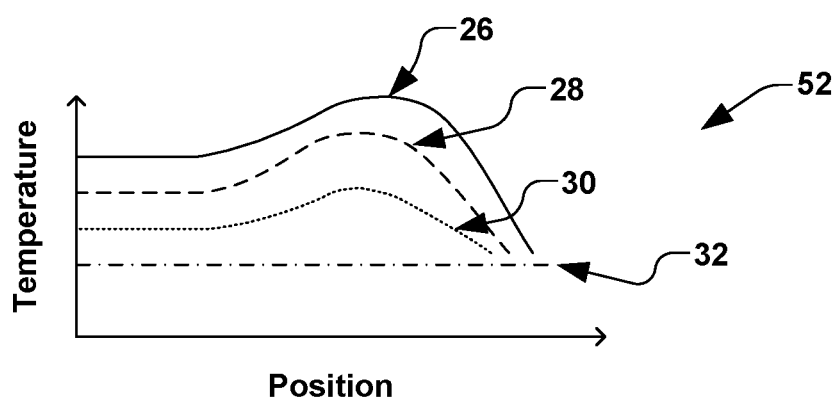
FIG. 3B illustrates a graph of temperature across a workpiece after exposure to the conventional moving focused energy source of FIG. 3A.

As such, exposure of the workpiece 14 to the focused lithographic energy 38 yields even greater non-uniformity of temperature distribution as illustrated a graph 52 of FIG. 3B. As can be seen, the lithographic film temperature 26, workpiece temperature 28, and heat sink temperature 30 are not only non-uniform across the workpiece 14 of FIG. 3A, but also the temperature of each appears as a wave based on the location where the workpiece is exposed to the moving focused energy source 46. Again, as illustrated in FIG. 3B, all of the lithographic film temperature 26, workpiece temperature 28, and heat sink temperature 30 are not only greater than the target temperature 32 for the process, but also, the respective temperatures are generally non-uniform across the workpiece.

Figure 4:
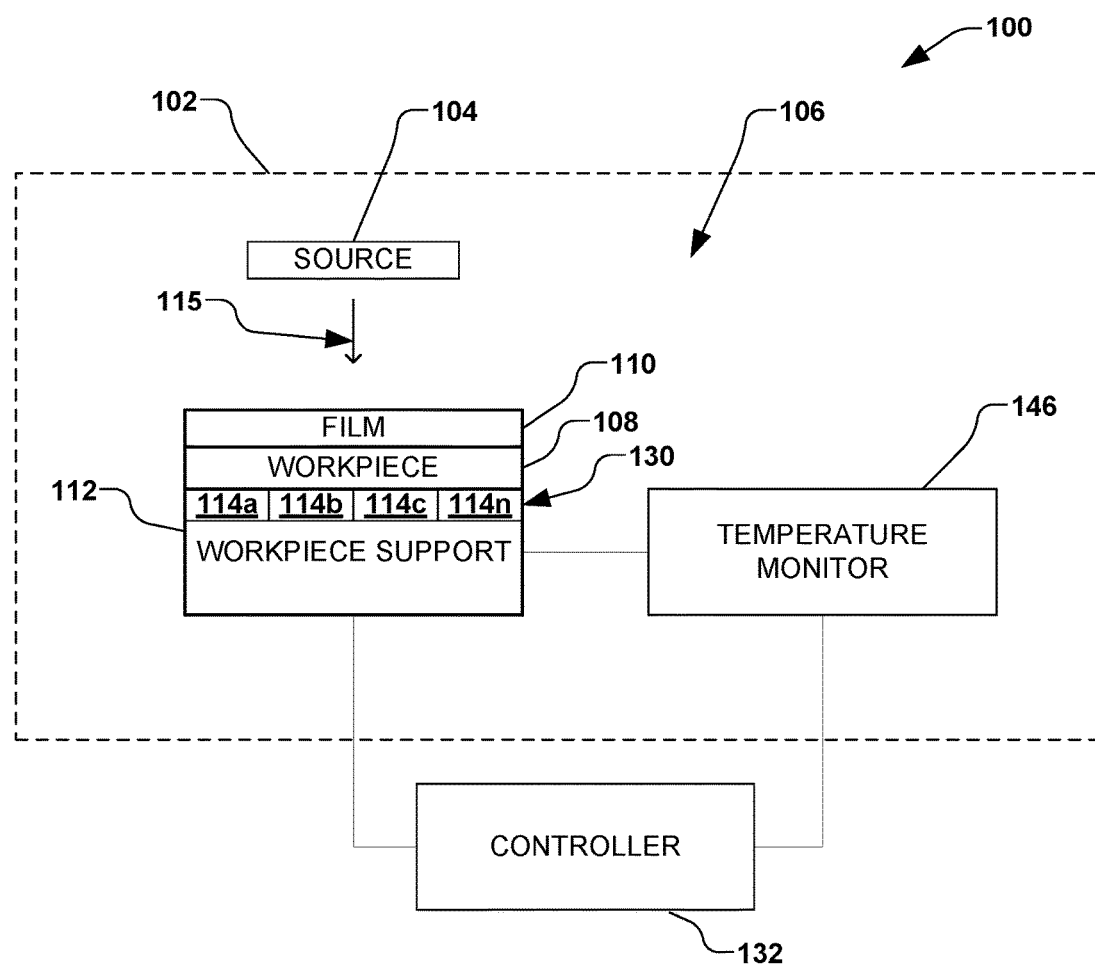
FIG. 4 illustrates a block diagram of an exemplary system for providing a homogeneous thermal equalization across a workpiece utilizing a thermal equalization apparatus according to other aspect of the present disclosure.

Thus in accordance with the present disclosure, a system 100 is provided in FIG. 4 for providing a thermal uniformity during a lithographic process. The system 100, for example, comprises vacuum chamber 102, wherein a lithographic energy source 104 provided. The lithographic energy source 104, for example, comprises an EUV or EBMW lithographic source configured to operate in a vacuum environment 106. It should be noted that in some embodiments, the vacuum chamber 102 can be omitted, such as in traditional optical lithography (e.g., 193 nm lithography).

A workpiece 108 is further provided, wherein in the present example, the workpiece has a lithographic film 110 formed there over. It should also be noted that in some embodiments of the present disclosure, no lithographic film is provided on the workpiece 108, such as evidenced in Electron Beam Induced Deposition (EBID) lithography. A workpiece support 112 is further provided, wherein the workpiece support has a plurality of thermal devices 114a, 114b, 114c, . . . 114n embedded therein, where n can be any positive number. The workpiece support 112, for example, is configured to support the workpiece 108 concurrent to an exposure of the workpiece to lithographic energy 115 from the lithographic energy source 104.

Figure 5A:
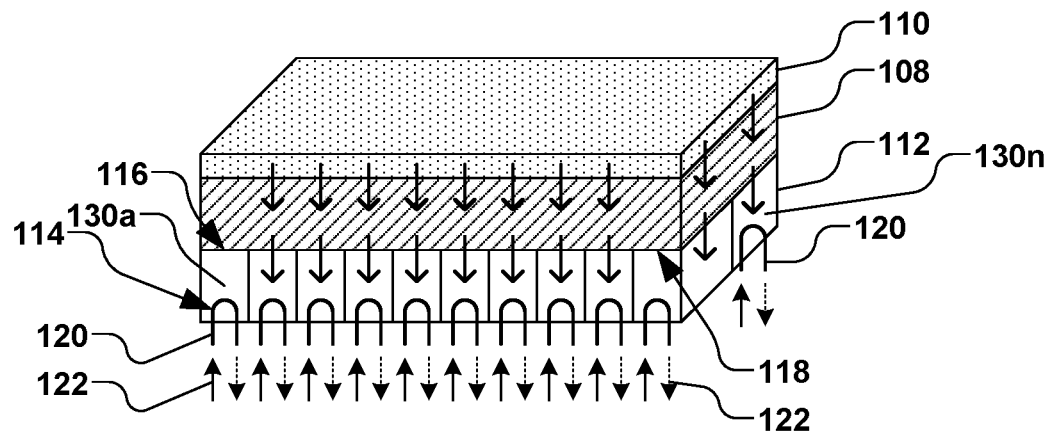
FIGS. 5A-5C illustrate various thermal equalization apparatus according to various examples of the present disclosure.
Figure 5B:
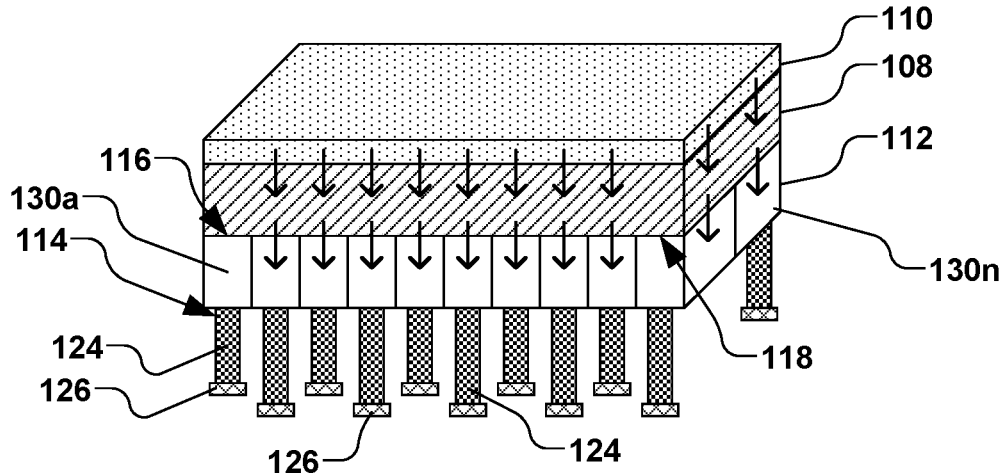
Figure 5C:
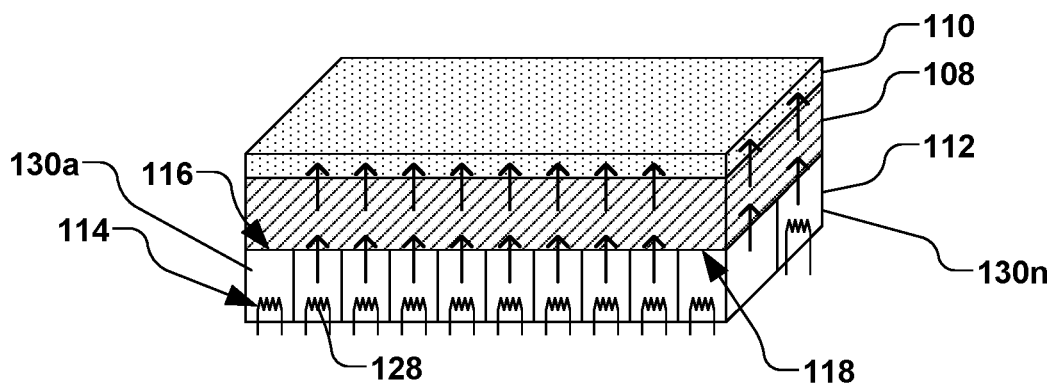

In several examples shown in FIGS. 5A-5C, the workpiece support 112 comprises a generally planar surface 116 whereon the workpiece 108 resides, and wherein the generally planar surface generally contracts the entirety of a backside surface 118 of the workpiece. In accordance with the example of FIG. 5A, each of the plurality of thermal devices 114 comprise a thermal conduit 120 configured to pass a fluid 122 there through. The fluid 122, for example, can comprise a cooling fluid or a heating fluid, based on the desired temperature of operation. In the example of FIG. 5B, each of the plurality of thermal devices 114 comprise a heat pipe 124 and a Peltier device 126, wherein the heat pipe and Peltier device are configured to cool and/or heat the workpiece 108 residing on the workpiece support 112. In the example of FIG. 5C, each of the plurality of thermal devices 114 comprise an electric coil 128, wherein the electric coil is configured to heat the workpiece 108 residing on the workpiece support. The present disclosure further contemplates any combination of the thermal devices 114 being implemented in one workpiece support 112, wherein one or more of cooling and heating can be performed on the workpiece 108 during exposure to lithographic energy 115 of FIG. 4. The plurality of thermal devices 112, for example, are configured to cool and/or heat the workpiece 108 at a respective predetermined location 130 associated with each of the plurality of thermal devices 114.

Referring again to FIG. 4, a controller 132 is further provided, wherein the controller is configured to individually control a temperature of each of the plurality of thermal devices 114, therein controlling a specified temperature distribution across the workpiece 108 associated with the exposure of the workpiece to the lithographic energy 115. The controller 132, for example, is configured to selectively activate one or more of the plurality of thermal devices 114 concurrent to an exposure of the workpiece to the lithographic energy 115 from the lithographic energy source 104.

Figure 6A:
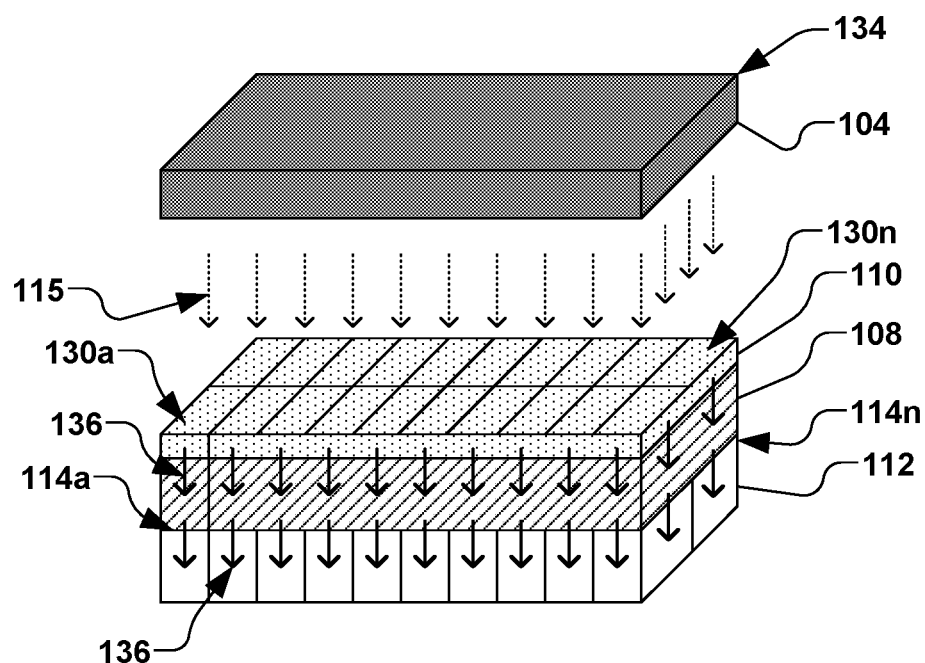
FIG. 6A illustrates a thermal equalization apparatus in association with a broad energy source in accordance with various aspect of the present disclosure.

The lithographic energy source 104, for example, can comprise a broad energy source 134 illustrated in FIG. 6A, for example, wherein the broad source configured to concurrently direct lithographic energy 115 to each of the respective locations 130 on the workpiece 108. The broad energy source 134, for example, comprises an EUV lithographic energy source, such as a mercury lamp employed in the vacuum chamber 102 of FIG. 4. Accordingly, during an exposure of the workpiece 108 to lithographic energy 115 from the broad energy source 134, thermal energy associated with the broad energy source transfers from the broad energy source through the lithographic film 110 and workpiece, and into the plurality of thermal devices 114 (illustrated by arrows 136).

Figure 6B:
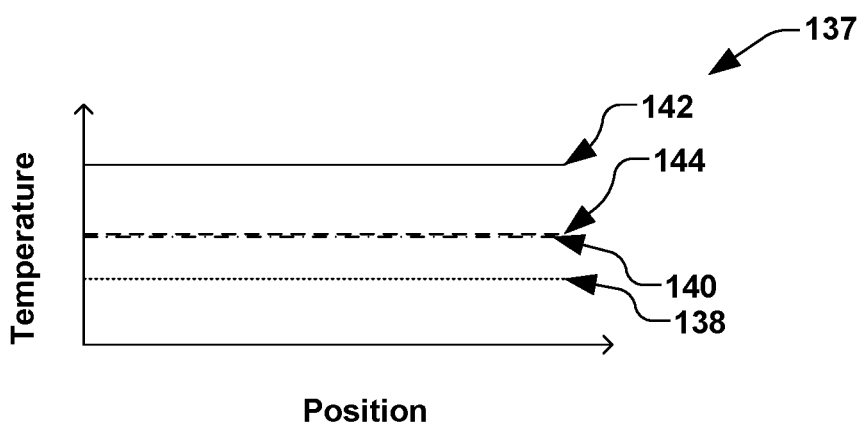
FIG. 6B illustrates a graph of temperature across a workpiece after exposure to the broad energy source utilizing the thermal equalization apparatus of FIG. 6A.

As illustrated in graph 137 FIG. 6B, a thermal device temperature 138 associated with the plurality of thermal devices 114 can be maintained at a temperature that is lower than a target temperature 140 for the workpiece. For example, the target temperature 140 can be the room temperature in the semiconductor factory, such as 25 degrees Centigrade. As such, a lithographic film temperature 142 and workpiece temperature 144 can be maintained in an acceptable range by control of the thermal device temperature 138.

Referring again to FIG. 4, in one example, the system 100 further comprises one or more temperature sensors, 146 wherein the one or more temperature sensors are configured to measure a temperature of the workpiece 108 associated with the respective location 130 on the workpiece that is further associated with each of the plurality of thermal devices 114. The one or more temperature sensors 146, for example, comprise one or more of a thermocouple and pyrometer associated with each respective location 130 on the workpiece 108. In another example, the one or more temperature sensors 146 can comprise a plurality of thermocouples respectively associated with the plurality of thermal devices 114. As such, feedback control from the one or more temperature sensors 146 to the controller 132 can be advantageously achieved.

Figure 7A:
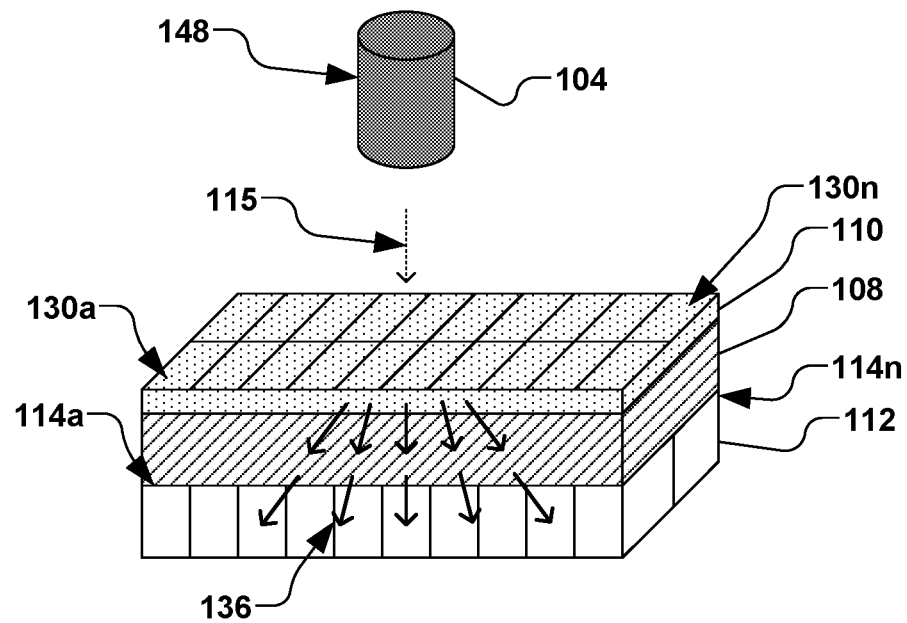
FIG. 7A illustrates a thermal equalization apparatus in association with a focused energy source in accordance with various aspect of the present disclosure.

Referring now to FIG. 7A, in accordance with another example, the lithographic energy source 104 comprises a focused energy source 148. The focused energy source 148, for example, is configured to selectively direct lithographic energy 115 to each or any of the respective locations 130 on the workpiece 108. The focused energy source 148, for example, comprises an EBMW lithographic source employed in the vacuum chamber 102 of FIG. 4. Accordingly, an exposure of the workpiece 108 to lithographic energy 115 from the focused energy source 148 can provide a non-uniform temperature distribution as illustrated a graph 42 of FIG. 2B.

Figure 7B:
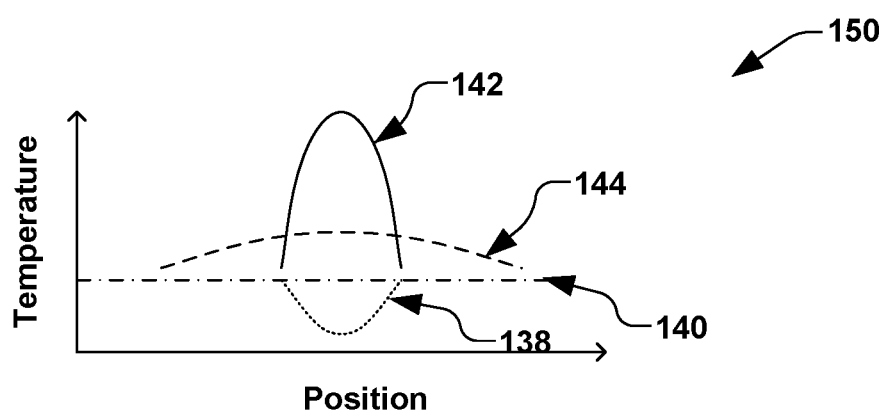
FIG. 7B illustrates a graph of temperature across a workpiece after exposure to the focused energy source utilizing the thermal equalization apparatus of FIG. 7A.

However, in accordance with the present disclosure, as illustrated in graph 150 of FIG. 7B, the thermal device temperature 138 associated with the plurality of thermal devices 114 can be controlled to a temperature that is lower than a target temperature 140 at the location 130 of FIG. 7A that is being exposed to the lithographic energy 115 from the focused energy source 148. As such, the lithographic film temperature 142 and workpiece temperature 144 can again be maintained in an acceptable range by control of the thermal device temperature 138. Furthermore, the controller 132 of FIG. 4 can be configured to selectively activate one or more of the plurality of thermal devices 114 prior to an exposure of the respective location 130 on the workpiece 108 to the lithographic energy 115, therein thermally preparing the workpiece for the exposure.

Figure 8A:
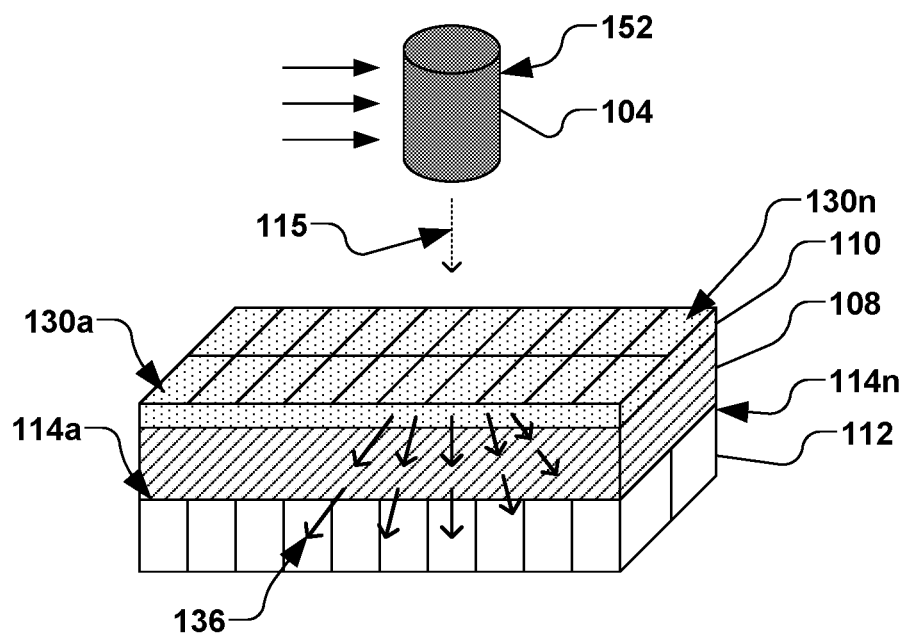
FIG. 8A illustrates a thermal equalization apparatus in association with a moving focused energy source in accordance with various aspect of the present disclosure.

Referring to FIG. 8A, in accordance with another example, the lithographic energy source 104 comprises a translating energy source 152. While being referred to as a translating energy source 152, it shall be understood that any relative motion between the lithographic energy source and the workpiece 108 is contemplated. For example, the lithographic energy source 104 can be translated with respect to workpiece 108 that remains stationary, the workpiece can be translated relative to a lithographic energy source that remains stationary, or any combination thereof.

Accordingly, the translating energy source 152, for example, is configured to selectively direct lithographic energy 115 to each or any of the respective locations 130 on the workpiece 108 during the translation thereof. The translating energy source 152, for example, comprises an EBMW lithographic source employed in the vacuum chamber 102 of FIG. 4, along with a translation apparatus (not shown) configured to translate one of the workpiece and energy source with respect to the other. Accordingly, an exposure of the workpiece 108 to lithographic energy 115 from the focused energy source 152 can provide a non-uniform temperature distribution as illustrated a graph 52 of FIG. 3B.

Figure 8B:
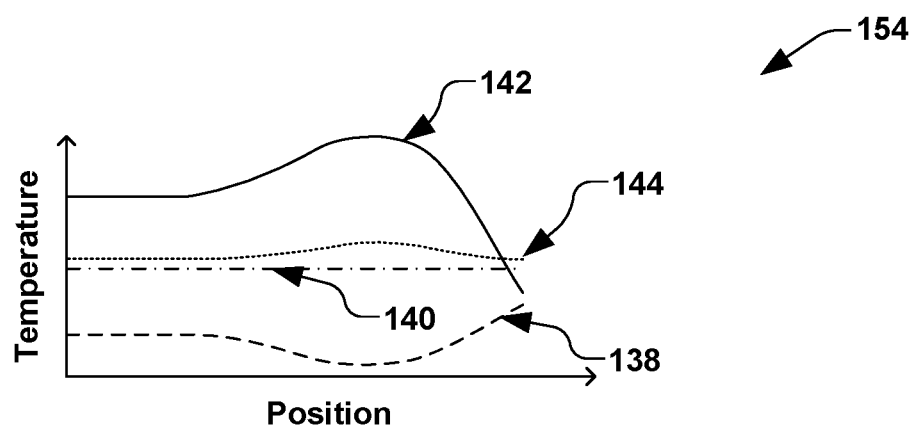
FIG. 8B illustrates a graph of temperature across a workpiece after exposure to the moving focused energy source utilizing the thermal equalization apparatus of FIG. 8A.

Once again, however, in accordance with the present disclosure, as illustrated in graph 154 of FIG. 8B, the thermal device temperature 138 associated with the plurality of thermal devices 114 can be controlled to a temperature that is lower than a target temperature 140 at the location 130 of FIG. 8A that is being exposed to the lithographic energy 115 from the lithographic energy source 104. As such, the lithographic film temperature 142 and workpiece temperature 144 can again be maintained in an acceptable range by control of the thermal device temperature 138. Furthermore, the controller 132 of FIG. 4 can be configured to selectively activate one or more of the plurality of thermal devices 114 prior to an exposure of the respective location 130 on the workpiece 108 to the lithographic energy 115, therein thermally preparing the workpiece for the exposure.

In one example, the controller 132 is configured to predict a temperature of the workpiece 108 at one or more of the predetermined locations 130 on the workpiece, wherein the controller is further configured to activate one or more of the plurality of thermal devices 114 based, at least in part, on the prediction of the temperature of the workpiece at the one or more predetermined locations. For example, as illustrated in the graph 154 of FIG. 8B, the thermal device temperature 138 can be controlled to predict the resulting workpiece temperature 144 after the workpiece 108 of FIG. 8A is exposed to the lithographic energy 115. In another example, the prediction of the temperature of the workpiece 108 at the predetermined position 130 can be based, at least in part, on a measured temperature at one or more of the predetermined locations on the workpiece, as discussed above. In accordance with yet another example, the controller 132 is configured to activate the plurality of thermal devices 114 based on a model to estimate the heat transferring from the lithographic film 110 through workpiece 108 to the workpiece support 112. As such, the controller 132 is configured to selectively activate one or more of the plurality of thermal devices 114 prior to an exposure of the respective location 130 on the workpiece 108 to the lithographic energy 115.

Figure 9:
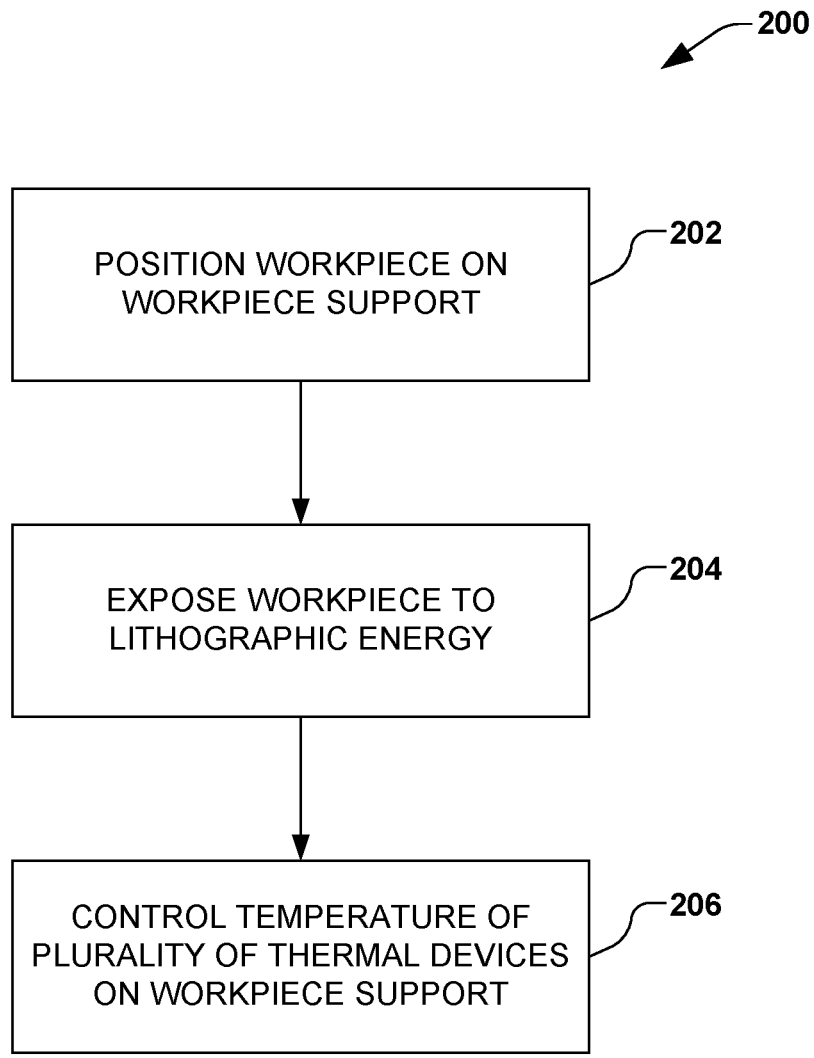
FIG. 9 illustrates an exemplary methodology for providing a homogeneous thermal equalization across a workpiece.

In accordance with still another exemplary aspect of the present invention, FIG. 9 is a schematic block diagram of an exemplary method 200 for providing a thermal uniformity during a lithographic process. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 9, the method comprises positioning a workpiece having a lithographic film formed thereover on a workpiece support in act 202. The workpiece is further exposed to a source of lithographic energy 204. In act 206, a temperature of each of a plurality of thermal devices embedded in the workpiece support is controlled concurrent with the exposure of the workpiece to the source of lithographic energy, therein controlling a temperature distribution across the workpiece. Controlling the temperature of each of the plurality of thermal devices in act 206, for example, can comprise selectively activating one or more of the plurality of thermal devices. Further, the temperature of each of the plurality of thermal devices can be controlled by predicting a temperature of the workpiece at one or more predetermined locations on the workpiece, and activating one or more of the plurality of thermal devices based, at least in part, on the prediction of the temperature of the workpiece at the one or more predetermined locations. Alternatively, control of the temperature of each of the plurality of thermal devices in act 206 can be based on a model. Furthermore, a temperature of the workpiece can be measured at a respective location associated with each of the plurality of thermal devices wherein controlling the temperature of each of the plurality of thermal devices is further based, at least in part, on the measured temperature.

Figure 10:
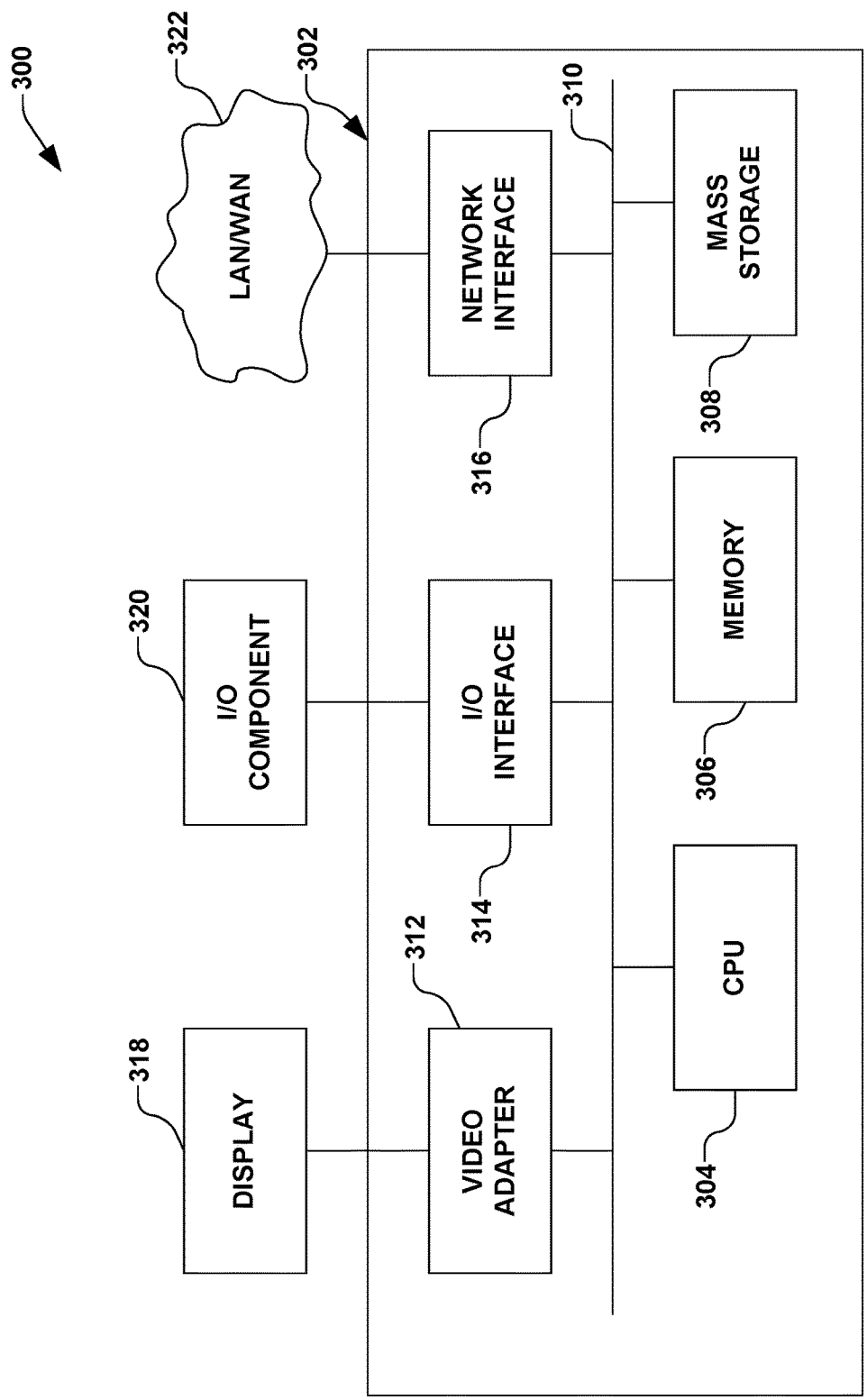
FIG. 10 illustrates a schematic representation of a processor-based system for providing thermal uniformity during a lithographic process.

In accordance with another aspect, the aforementioned methodology may be implemented using computer program code in one or more general purpose computer or processor based system. As illustrated in FIG. 10, a block diagram is provided of a processor based system 300 is provided in accordance with another embodiment for providing a thermal uniformity during a lithographic process.

The processor based system 300, for example, is a general purpose computer platform and may be used to implement processes discussed herein. The processor based system 300 may include a processing unit 302, such as a desktop computer, a workstation, a laptop computer, or a dedicated unit customized for a particular application. The processor based system 300 may be equipped with a display 318 and one or more input/output devices 320, such as a mouse, a keyboard, or printer. The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may include any type of electronic data processor, and the memory 306 may include any type of system memory, such as static random access memory (SRAM), dynamic random access memory (DRAM), or read-only memory (ROM).

The mass storage device 308 may include any type of storage device configured to store data, programs, and other information and to make the data, programs, and other information accessible via the bus 310. The mass storage device 308 may include, for example, one or more of a hard disk drive, a magnetic disk drive, or an optical disk drive.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

It should be noted that the processor based system 300 may include other components. For example, the processor based system 300 may include power supplies, cables, a motherboard, removable storage media, cases, and the like. These other components, although not shown, are considered part of the processor based system 300.

Embodiments of the present disclosure may be implemented on the processor based system 300, such as by program code executed by the CPU 304. Various methods according to the above-described embodiments may be implemented by program code. Accordingly, explicit discussion herein is omitted.

Further, it should be noted that the modules and devices in FIG. 8 may all be implemented on one or more processor based systems 300 of FIG. 10. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based system 300 by the I/O interface 314 or network interface 316. A person having ordinary skill in the art will readily understand other variations and modifications in implementing systems and methods that are contemplated within the scope of varying embodiments.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While the method(s) provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A system for providing a thermal uniformity during a lithographic process, the system comprising:
   a substrate support having a plurality of thermal devices embedded therein, wherein the substrate support is configured to support a substrate having a layer disposed over the substrate, and wherein the plurality of thermal devices are arranged in a series of rows and columns running perpendicular to one another within the substrate support; and
   wherein the plurality of thermal devices each include a pair of fluid conduit segments extending perpendicularly towards a face of the substrate support with an arcuate fluid conduit segment coupling the pair of fluid conduit segments to one another, such that each thermal device has a generally inverted u-shape.

2. The system of claim 1, wherein the plurality of thermal devices are configured to heat or cool the substrate at a respective predetermined location associated with each of the plurality of thermal devices.

3. The system of claim 1, wherein the substrate support comprises a generally planar surface on which the substrate resides and which is in contact with a backside of the substrate.

4. The system of claim 1, wherein each of the plurality of thermal devices comprises a Peltier device.

5. The system of claim 1, further comprising one or more temperature sensors, wherein the one or more temperature sensors are configured to measure a temperature of the substrate at a respective location associated with each of the plurality of thermal devices.

6. The system of claim 5, wherein the one or more temperature sensors comprise one or more of a thermocouple and pyrometer.

7. The system of claim 1, further comprising:
   a controller, wherein the controller is configured to individually control a temperature of each of the plurality of thermal devices, therein controlling a specified temperature distribution across the substrate and correspondingly controlling a temperature distribution across the layer.

8. The system of claim 7, wherein the specified temperature distribution comprises a uniform temperature distribution across the substrate.

9. The system of claim 7, wherein controller is configured to use a model to predict a temperature of the substrate at one or more predetermined locations on the substrate, and wherein the controller is further configured to activate one or more of the plurality of thermal devices based, at least in part, on the prediction of the temperature of the substrate at the one or more predetermined locations.

10. The system of claim 9, wherein prediction of the temperature of the substrate at the one or more predetermined locations is based, at least in part, on a measured temperature at one or more of the predetermined locations on the substrate.

11. The system of claim 9, further comprising:
   a lithographic energy source, wherein the substrate support is configured to support the substrate concurrent to an exposure of the substrate to lithographic energy from a lithographic energy source.

12. The system of claim 11, further comprising:
   a vacuum chamber, wherein the substrate support is configured to support the substrate within the vacuum chamber concurrent to the exposure of the substrate to the lithographic energy.

13. The system of claim 11, wherein the controller is configured to activate the plurality of thermal devices prior to an exposure of the substrate to the lithographic energy.

14. The system of claim 11, wherein the lithographic energy source is an electron beam direct-write or extreme ultraviolet lithography energy source.

15. A system for providing a thermal uniformity during a lithographic process, the system comprising:
- a workpiece support having a plurality of thermal devices embedded under or within a face of the workpiece support, wherein the workpiece support is configured to support a workpiece having a film disposed there over, and wherein the plurality of thermal devices each include a pair of fluid conduit segments extending perpendicularly towards the face of the workpiece support with an arcuate fluid conduit segment coupling the pair of fluid conduit segments to one another; and
- a controller configured to individually control a temperature of each of the plurality of thermal devices, therein controlling a specified temperature distribution across the workpiece.

16. The system of claim 15, wherein the controller is configured to selectively activate one or more of the plurality of thermal devices prior to an exposure of the respective location on the workpiece to lithographic energy.

17. The system of claim 15, wherein the specified temperature distribution comprises a temperature of the film, and wherein the controller is configured to selectively activate one or more of the plurality of thermal devices concurrent to an exposure of the workpiece to lithographic energy.

18. The system of claim 17, wherein a source of the lithographic energy comprises a focused energy source configured to selectively direct energy to each of the respective locations on the workpiece.

19. A method for providing a thermal uniformity during a lithographic process, the method comprising:
- positioning a substrate, which has a layer formed over a face of the substrate, on a substrate support, wherein the substrate support includes a plurality of thermal devices arranged in a series of rows and columns running perpendicular to one another and embedded in the substrate support, wherein the plurality of thermal devices each include a pair of fluid conduit segments extending vertically towards the face of the substrate with an arcuate fluid conduit segment coupling the pair of fluid conduit segments to one another; and
- heating or cooling each of the plurality of thermal devices, wherein the plurality of thermal devices are configured to heat or cool the substrate at a respective predetermined location, therein controlling a specified temperature distribution across the substrate.

20. The method of claim 19, further comprising:
selectively activating one or more of the plurality of thermal devices prior to exposure of the substrate to a source of lithographic energy.

* * * * *